US007722160B2

(12) United States Patent
Sung et al.

(10) Patent No.: US 7,722,160 B2
(45) Date of Patent: May 25, 2010

(54) NOZZLE PLATE, PRINTHEAD HAVING THE SAME AND METHODS OF OPERATING AND MANUFACTURING THE SAME

(75) Inventors: Gee-young Sung, Daegu-si (KR); Min-soo Kim, Seoul (KR); Kye-si Kwon, Seoul (KR); Se-young Oh, Yongin-si (KR); Seog-soon Baek, Suwon-si (KR); Mi-jeong Song, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 475 days.

(21) Appl. No.: 11/261,714

(22) Filed: Oct. 31, 2005

(65) Prior Publication Data

US 2006/0092239 A1 May 4, 2006

(30) Foreign Application Priority Data

Oct. 29, 2004 (KR) ..................... 10-2004-0087039

(51) Int. Cl.
*B41J 2/14* (2006.01)
*H01L 41/22* (2006.01)

(52) U.S. Cl. ....................................... 347/47; 29/25.35

(58) Field of Classification Search .................. 347/45, 347/67, 77, 47
See application file for complete search history.

(56) References Cited

U.S. PATENT DOCUMENTS

| | | | | |
|---|---|---|---|---|
| 4,346,387 | A * | 8/1982 | Hertz | 347/75 |
| 6,491,376 | B2 * | 12/2002 | Trauernicht et al. | 347/47 |
| 6,509,917 | B1 * | 1/2003 | Chwalek et al. | 347/82 |
| 6,702,413 | B2 * | 3/2004 | Takabayashi et al. | 347/8 |
| 2006/0012638 | A1 * | 1/2006 | Lee | 347/58 |

FOREIGN PATENT DOCUMENTS

| | | | |
|---|---|---|---|
| EP | 0 602 021 | A2 | 6/1994 |
| EP | 0 602 021 | A3 | 6/1994 |
| EP | 1 219 424 | A2 | 7/2002 |
| EP | 1 219 424 | A3 | 7/2002 |
| EP | 1 439 064 | A1 | 7/2004 |

* cited by examiner

*Primary Examiner*—An H Do
(74) *Attorney, Agent, or Firm*—Lee & Morse, P.C.

(57) ABSTRACT

A nozzle plate and printhead allowing for control of a deflection direction of ejected droplets using electro-wetting, and methods of operating and manufacturing the same. The nozzle plate has at least one nozzle for ejecting fluid and includes electrode segments disposed along a circumference of the nozzle, an insulating layer disposed on a surface of each electrode segment so as to contact fluid in the nozzle, the insulating layer divided into at least two insulating layer segments corresponding to the electrode segments, and a wire pattern electrically coupled to the electrode segments.

35 Claims, 9 Drawing Sheets

NOZZLE PLATE, PRINTHEAD HAVING THE SAME AND METHODS OF OPERATING AND MANUFACTURING THE SAME

BACKGROUND OF THE INVENTION

1. Field of the Invention

The present invention relates to a printhead. More particularly, the present invention relates to a nozzle plate and printhead that provide for control of a deflection direction of fluid ejected through a nozzle to improve a resolution of a printed image, and a method of manufacturing the same.

2. Description of the Related Art

Generally, a printhead is a device for printing an image on a surface of an object by ejecting droplets of fluid on a desired location of the object. A common printhead is an inkjet printhead that may print using a plurality of colors. Such an inkjet printhead may be classified, according to the method of ink ejection, into a thermal inkjet printhead and a piezoelectric inkjet printhead.

In the thermal inkjet printhead, ink is quickly heated by a heater, formed of a heating element, when a pulsed current is applied to the heater. The ink is heated until it boils and generates bubbles. The bubbles expand and apply pressure to ink filled in an ink chamber, thereby ejecting the ink out of the ink chamber through a nozzle in the form of droplets. Thus, in the thermal inkjet printhead, the heater functions as an actuator that generates the ejecting force for the ink.

In the piezoelectric inkjet printhead, a piezoelectric material is used as an actuator. A shape transformation of the piezoelectric material generates pressure, thereby ejecting the ink out of an ink chamber.

FIG. 1 illustrates a typical piezoelectric inkjet printhead. Referring to FIG. 1, a channel plate 10 is provided with an ink channel including a manifold 13, a plurality of restrictors 12 and a plurality of ink chambers 11. A nozzle plate 20 is provided having a plurality of nozzles 22 that corresponds to the plurality of ink chambers 11. A plurality of piezoelectric actuators 40 is disposed on the channel plate 10. The manifold 13 functions to supply ink from an ink storage region (not shown) to the plurality of ink chambers 11. The restrictor 12 functions as a channel through which ink is introduced from the manifold 13 to the corresponding ink chamber 11. The ink chamber 11 stores ink that is to be ejected. Ink chambers 11 may be arranged on one or both sides of the manifold 13. The volume of the ink chamber 11 varies as the corresponding piezoelectric actuator 40 is driven, thereby generating pressure variations to eject ink through the nozzle 22 and draw ink through the restrictor 12. In detail, a top wall (i.e., ceiling) portion of each ink chamber 11 on the channel plate 10 is designed to function as a vibration plate 14 that is deformed by the piezoelectric actuator 40.

The piezoelectric actuator 40 includes a lower electrode 41 disposed on the channel plate 10, a piezoelectric layer 42 disposed on the lower electrode 41 and an upper electrode 43 disposed on the piezoelectric layer 42. Disposed between the lower electrode 41 and the channel plate 10 is an insulating layer 31 such as a silicon oxide layer. The lower electrode 41 is formed on an overall top surface of the insulating layer 31 to function as a common electrode. The piezoelectric layer 42 is formed on the lower electrode 41 and is located above the corresponding ink chamber 11. The upper electrode 43 is formed on the piezoelectric layer 42 and functions as a driving electrode, applying voltage to the piezoelectric layer 42.

When an image is printed using the above-described typical inkjet printhead, the resolution of the image is significantly affected by the number of nozzles per inch. The number of nozzles per inch is represented by "Channels per Inch (CPI)" and the image resolution is represented by "Dots per Inch (DPI)." In the typical inkjet printhead, the improvement of the CIP depends on continuing improvements in processing technology. However, current trends in processing technology may not keep pace with demands for increasingly higher resolution images. Therefore, a variety of technologies for printing a higher DPI image using a low CPI printhead have been developed.

FIGS. 2 and 3 illustrate examples of technologies for printing a higher DPI image using a low CPI printhead. Referring to FIG. 2, a plurality of nozzles 51 and 52 are arranged along two or more rows and may be staggered. The array of the nozzles 51 and 52 may be used to print an image forming a single line. That is, dots 61, formed by the nozzles 51 arranged along the first row, and dots 62, formed by the nozzles 52 arranged along the second row, alternate on a print medium 60, e.g., a sheet of paper. In the illustrated example, the image DPI formed on the paper 60 is two times the CPI of the printhead 50.

However, in order to precisely print the image, the nozzles 51 and 52 must be arranged accurately along the respective rows. Therefore, this requires an alignment system that can precisely arrange the nozzles 51 and 52, which may increase the printhead size and cost.

In the example depicted in FIG. 3, printing utilizes a printhead 70, having a relatively low CPI, which is inclined at a predetermined angle Θ with respect to a print medium 80, e.g., a flexible substrate or a sheet of paper. The inclination of the printhead 70 results in the intervals between dots 81 formed on the paper 80 becoming less than the intervals between the nozzles 71 of the printhead 70. Thus, the DPI of the image printed on the paper 80 is higher than the CPI of the printhead 70. In this example, the greater the inclined angle Θ, the higher the DPI. However, the inclination of the printhead causes the printing area to be reduced so that the length of the printhead 70 must be increased in order to maintain coverage of the paper 80.

SUMMARY OF THE INVENTION

The present invention is therefore directed to a nozzle plate and printhead that provide for control of a deflection direction of fluid ejected through a nozzle to improve a resolution of a printed image, and to methods of operating and manufacturing the same, which substantially overcome one or more of the problems due to the limitations and disadvantages of the related art.

It is a feature of an embodiment of the present invention to provide a nozzle plate and printhead that enable printing of images at a DPI higher than a CPI of the nozzle plate.

It is another feature of an embodiment of the present invention to provide a nozzle plate and printhead that can control a deflection direction of fluid ejected through a nozzle using electro-wetting.

It is a further feature of an embodiment of the present invention to provide a nozzle plate and printhead including electrode segments to control a contact angle of a fluid to be ejected using electro-wetting.

It is yet another feature of an embodiment of the present invention to provide methods of operating a printhead and forming an electro-wetting nozzle plate.

At least one of the above and other features and advantages of the present invention may be realized by providing a nozzle plate having at least one nozzle for ejecting fluid, the nozzle plate including at least one electrode segment disposed along a circumference of the nozzle, an insulating layer disposed on a surface of the electrode segment so as to contact fluid in the nozzle, and a wire pattern electrically coupled to the electrode segment.

The electrode segment may extend along less than about half of the circumference of the nozzle. There may be at least two electrode segments disposed along the circumference of the nozzle, the insulating layer may be divided into at least two insulating layer segments corresponding to the electrode segments, and the wire pattern may be electrically coupled to the electrode segments. The wire pattern may be individually coupled to each electrode segment, such that each electrode segment can be alternately energized. The insulating layer segments may form a portion of an inner surface of the nozzle, such that the inner surface of the nozzle includes at least two separate sections defined by the insulating layer segments. The nozzle may have four insulating layer segments and four corresponding electrode segments arranged at equal intervals along the circumference of the nozzle. The nozzle plate may further include a substrate through which the nozzle penetrates and on which the electrode segments and the wire pattern are disposed. The substrate may be a base substrate for a printed circuit board. The nozzle plate may further include a protective layer disposed on the substrate so as to cover the electrode segments and the wire pattern. The protective layer may be a hydrophobic insulating material. The protective layer may be a photo solder resist. The electrode segment may be a low resistance material. The electrode segment and the wire pattern may be copper. The insulating layer may be a hydrophobic layer. The insulating layer may include at least one of $SiO_2$, SiN, and $Ta_2O_5$. The insulating layer may be a hydrophilic layer.

At least one of the above and other features and advantages of the present invention may also be realized by providing a printhead including a channel region including a plurality of fluid chambers, an actuator, and a nozzle region including a plurality of nozzles, each nozzle coupled to a corresponding fluid chamber, wherein each nozzle may include at least one electrode segment disposed along a circumference of the nozzle, an insulating layer disposed on a surface of the electrode segment so as to contact fluid in the nozzle, and a wire pattern electrically coupled to the electrode segment.

The printhead may further include an electric circuit, the electric circuit coupled to the wire pattern and configured to supply a voltage having a first polarity to the fluid and to supply a voltage having a second polarity opposite the first polarity to the wire pattern. There may be at least two electrode segments disposed along the circumference of the nozzle, the insulating layer may be divided into at least two segments corresponding to the electrode segments, and the wire pattern may be electrically coupled to the electrode segments. The at least two electrode segments may include a first electrode segment and a second electrode segment, such that the nozzle plate includes a plurality of first electrode segments and a plurality of second electrode segments, the printhead further including an electric circuit coupled to the wire pattern and configured to supply a voltage having a first polarity to the fluid and to alternately supply a voltage having a second polarity to the first and second electrode segments. The electric circuit may be configured to supply the voltage having the second polarity to the plurality of first electrode segments simultaneously. The nozzle may include four insulating layer segments and four corresponding electrode segments arranged at equal intervals along the circumference of the nozzle. The printhead may further include a substrate on which the electrode segment and the wire pattern are disposed, and a protective layer disposed on the substrate so as to cover the electrode segment and the wire pattern.

At least one of the above and other features and advantages of the present invention may further be realized by providing a method of manufacturing a nozzle plate having at least one nozzle for ejecting fluid, including forming an electrode having at least one segment and a wire pattern connected to the segment of the electrode on a substrate, forming a protective layer on the substrate, forming the nozzle, and forming an insulating layer only on the segment of the electrode.

Forming the electrode and the wire pattern may include depositing a metal layer on the substrate and patterning the metal layer to form both the electrode and the wire pattern. Forming the protective layer may include depositing a hydrophobic insulating material. Forming the nozzle may include forming a first portion of the nozzle by forming a tapered void in the substrate using a laser, and forming a second portion of the nozzle by forming a cylindrical void in the electrode and the protective layer using drilling or etching. Forming the second portion of the nozzle may expose the segment of electrode along a circumference of the cylindrical void. The electrode may have at least two segments, the insulating layer may be formed only on each of the segments of the electrode, and forming the insulating layer only on each of the segments of the electrode may include forming a number of hydrophobic insulating layer segments on the segments of the electrode, the number of hydrophobic insulating layer segments equal to the number of segments of the electrode. Forming the insulating layer only on each of the segments of the electrode may include using plasma enhanced chemical vapor deposition to selectively deposit $SiO_2$ or SiN directly on an exposed surface of each segment of the electrode and not on any adjacent regions of the nozzle plate. Forming the insulating layer only on each of the segments of the electrode may include using atomic layer deposition to selectively deposit $Ta_2O_5$ directly on an exposed surface of each segment of the electrode and not on any adjacent regions of the nozzle plate.

At least one of the above and other features and advantages of the present invention may also be realized by providing a method of operating a printhead including a nozzle having at least one electrode segment disposed adjacent thereto, the method including applying pressure to a fluid contained in the printhead in order to eject a first droplet of the fluid from the nozzle, applying a voltage having a first polarity to the fluid contained in the printhead, and applying a voltage having a second polarity opposite the first polarity to the electrode segment in order to eject the first droplet in a first direction.

The electrode segment may be electrically insulated from the fluid by an insulating layer and applying the voltages having the first and second polarities may create an electric potential across the insulating layer to change a contact angle of the fluid with respect to the nozzle. The method may further include applying pressure to the fluid contained in the printhead in order to eject a second droplet of the fluid from the nozzle, and removing the voltage having the second polarity in order to eject the second droplet in a second direction, wherein the first direction is not coaxial with the nozzle and the second direction is coaxial with the nozzle. The nozzle may have two electrode segments disposed adjacent thereto, the electrode segments formed on opposite sides of the nozzle, the method further including alternately applying the voltage having the second polarity to each of the two electrode segments.

BRIEF DESCRIPTION OF THE DRAWINGS

The above and other features and advantages of the present invention will become more apparent to those of ordinary skill in the art by describing in detail exemplary embodiments thereof with reference to the attached drawings in which.

DETAILED DESCRIPTION OF THE INVENTION

Figure 1:
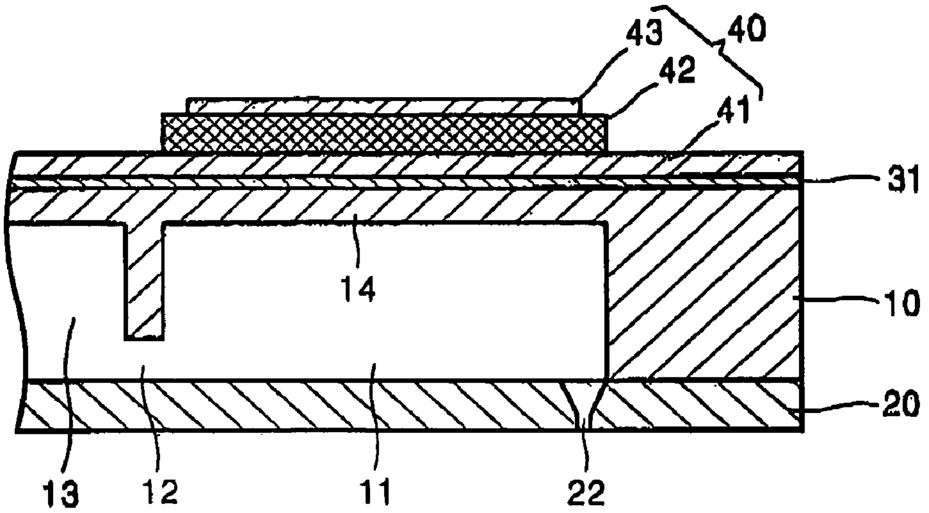
FIG. 1 (PRIOR ART)
FIG. 1 illustrates a schematic sectional view of a conventional inkjet printhead.
Figure 2:
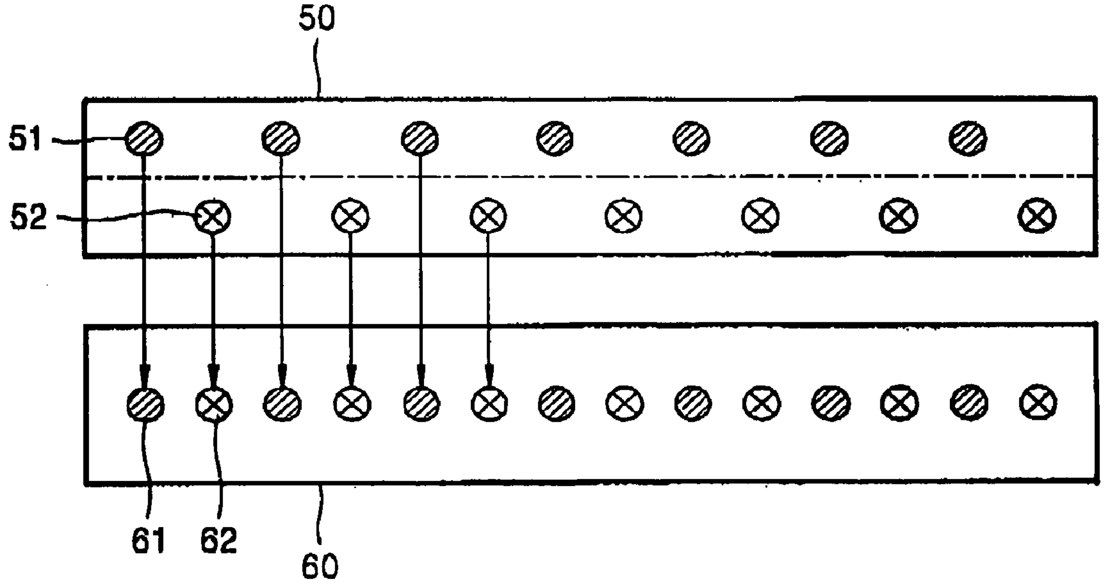
FIG. 2 (PRIOR ART)
FIGS. 2 and 3 illustrate schematic views of technologies for printing a high DPI image using a low CPI printhead.
Figure 3:
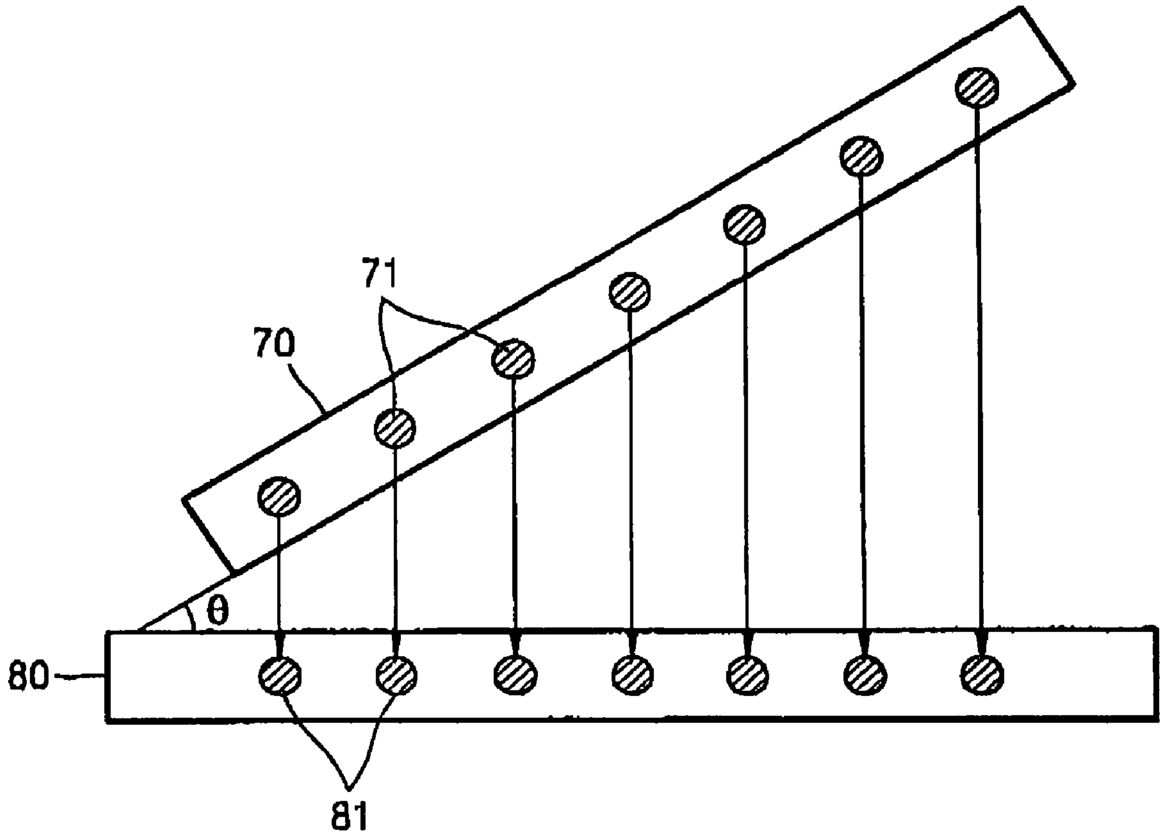
FIG. 3 (PRIOR ART)

Korean Patent Application No. 10-2004-0087039, filed on Oct. 29, 2004, in the Korean Intellectual Property Office, and entitled: "Nozzle Plate Unit, Inkjet Print Head with the Same and Method of Manufacturing the Same," is incorporated by reference herein in its entirety.

The present invention will now be described more fully hereinafter with reference to the accompanying drawings, in which exemplary embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. In the figures, the dimensions of layers and regions are exaggerated for clarity of illustration. It will also be understood that when a layer is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

A printhead according to the present invention may be used to eject fluid droplets through a nozzle and control the deflection of the droplets in a variety of directions using electro-wetting. A printhead according to the present invention may be used to print a high resolution image using a printhead having a relatively low CPI.

Figure 4A:
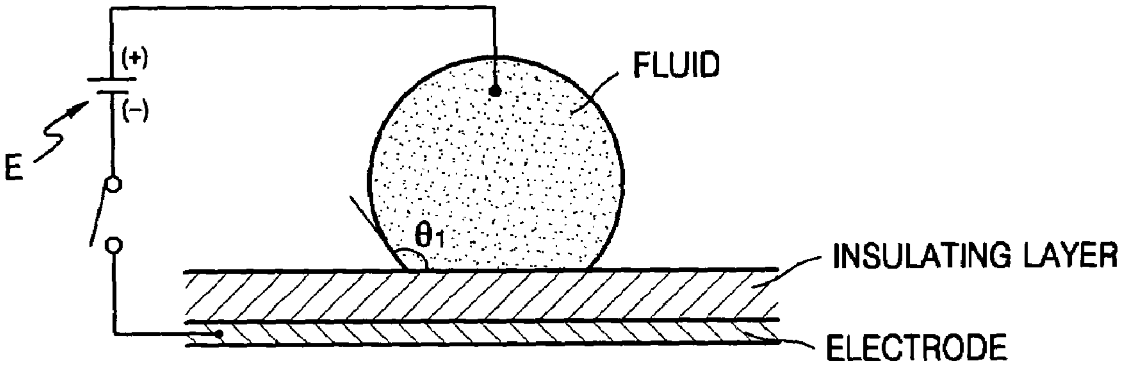
FIGS. 4A and 4B illustrate schematic views explaining electro-wetting according to the present invention.
Figure 4B:
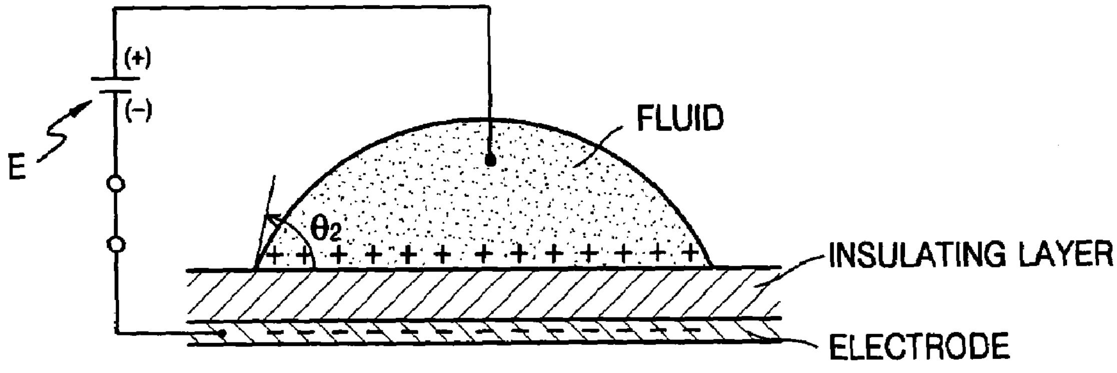

FIGS. 4A and 4B illustrate schematic views explaining electro-wetting according to the present invention. In these views, a spherical droplet (or hemispherical droplet in FIG. 4B) is shown positioned in contact with an electrically insulating layer, the insulating layer adjacent to an electro-wetting electrode. An external circuit having an energy source E is electrically coupled to the droplet and the electrode and is configured to supply a voltage thereto upon closing a switch. It will be appreciated that these illustrations are simplified so as not to obscure an understanding of the operation of the nozzle plate and printhead according to the present invention. Thus, the present invention is not limited to the illustrated configurations.

FIG. 4A illustrates an unenergized state, wherein no voltage is applied to the electro-wetting electrode. Where the fluid is, e.g., a hydrophilic ink, and the insulating layer is, e.g., hydrophobic, ink contacts the surface of the insulating layer at a first contact angle $\Theta_1$, which may be relatively large, due to a first surface tension of the fluid. FIG. 4B illustrates an energized state, wherein a voltage is applied to the ink, across the insulating layer. That is, a first polarity of the voltage is applied to the ink and a second polarity of the voltage, opposite the first polarity, is applied to the electrode. When the voltage is applied to the ink and the electrode, forming an electric field across the insulator, i.e., between the ink and the electrode, the ink contacts the surface of the hydrophobic insulating layer at a second contact angle $\Theta_2$, which may be relatively small, due to electro-wetting. Thus, the contact area between the ink and the insulating layer may be increased. It will be appreciated that the fluid to be ejected may be hydrophobic and the insulating layer may be hydrophilic while maintaining the described electro-wetting operation.

A more detailed explanation will now be provided, although the present invention is not bound by any particular theory. In detail, when the voltage is applied, an electric field is formed between the electrode and the ink, and negative electric charges accumulate on the electrode while positive electric charges accumulate on a surface of the ink opposite the electrode. Of course, where the polarity of the applied voltage is reversed, the accumulated charges will also be reversed. A repulsive force between the positive electric charges accumulated on the surface of the ink may result in the surface tension of the ink being reduced. Further, there is an attractive force between the negative electric charges accumulated on the electrode and the positive electric charges accumulated on the surface of the ink. Thus, where the fluid is a hydrophilic ink and the insulating layer interposed between the electrode and the ink is hydrophobic, the contact angle $\Theta_2$ of the ink with the hydrophobic insulating layer is reduced as a result of the voltage applied to the ink and the resulting reduction of the surface tension of the ink.

Figure 5A:
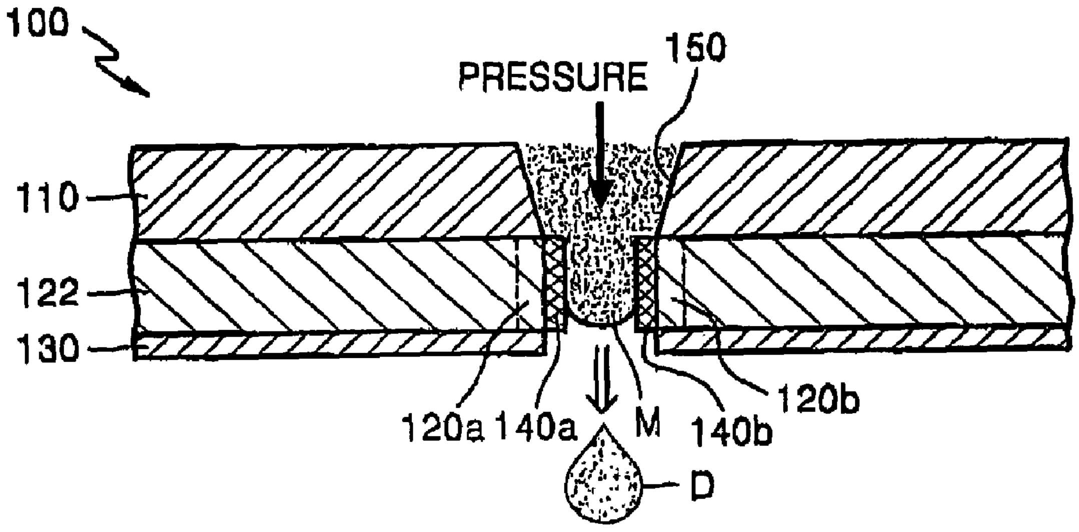
FIGS. 5A-5D illustrate sectional views of a printhead explaining droplet deflection according to the present invention.

FIGS. 5A-5D illustrate sectional views of a printhead explaining droplet deflection according to the present invention. Referring to FIG. 5A, a printhead 100 may include a substrate 110, a wire pattern 122 and a protective layer 130. The printhead 100 may further include first and second electrode segments 120*a* and 120*b*, covered by respective insulating layer segments 140*a* and 140*b* and disposed along a circumference of a nozzle 150. A pressure applied to a fluid may cause the fluid to be ejected through the nozzle 150 in the form of a droplet D. In the illustrations, the fluid is ejected in a downward direction.

In operation, when no voltage is applied to either of the first and second electrode segments 120*a*, 120*b*, the contact angles of the fluid, e.g., ink, with the first and second insulating segments 140*a*, 140*b*, e.g., hydrophobic insulating segments, may be essentially identical. In this case, as shown in FIG. 5A, a convex meniscus M is formed. The meniscus M is symmetric with respect to the first and second electrode segments 120*a*, 120*b*. When pressure is applied to fluid in the nozzle 150 by, e.g., a piezoelectric actuator, thermal energy, etc., the fluid is ejected from the nozzle 150 in the form of droplets. In particular, the fluid droplets D are ejected straight from the nozzle 150, i.e., in a direction coaxial with the nozzle 150 and perpendicular to the substrate 110.

Figure 5B:
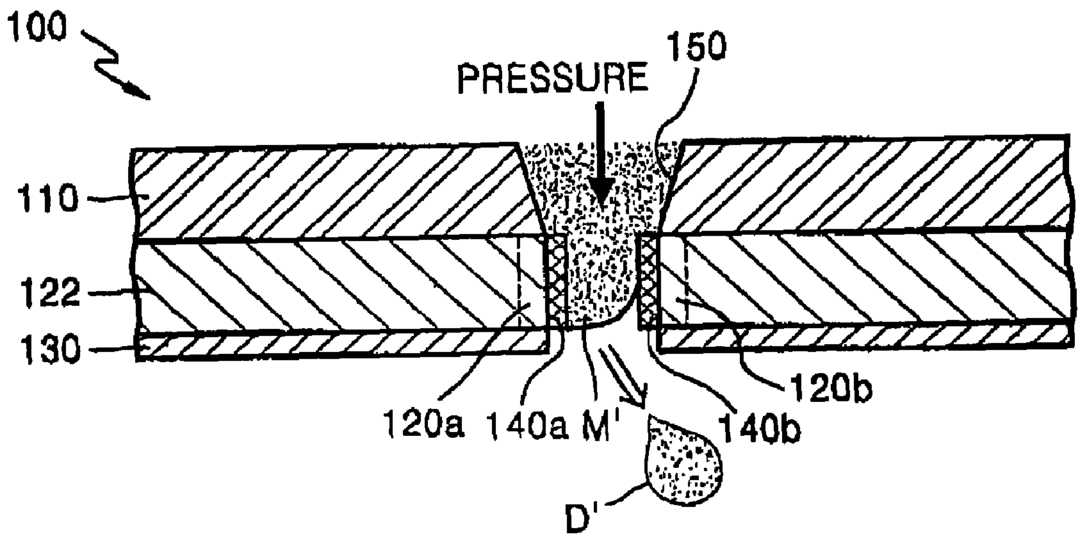

Referring to FIG. 5B, when a voltage is applied to the fluid and only the first electrode segment 120*a*, i.e., applied across the fluid and the first electrode segment 120*a*, the contact angle of the ink with the surface of the first hydrophobic insulating segment 140*a* is reduced. As a result, a meniscus M' is formed that is asymmetric with respect to the first and second electrode segments 120*a*, 120*b*, as illustrated in FIG. 5B. When pressure is applied to the fluid in the nozzle 150, the fluid droplet D' is ejected from the nozzle 150 at an angle, e.g., deflected to the right.

Figure 5C:
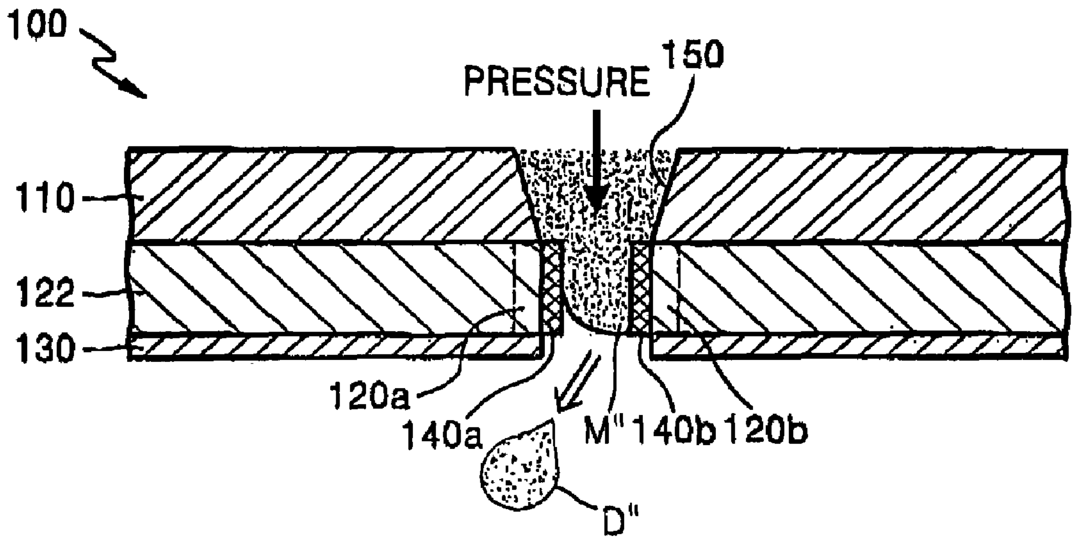

Referring to FIG. 5C, when a voltage is applied to only the second electrode segment 120*b*, the contact angle of the ink with the surface of the second hydrophobic insulating segment 140*b* is reduced. As a result, a meniscus M" is formed that is asymmetric with respect to the first and second electrode segments 120*a*, 120*b*. In particular, in this instance the meniscus M" is essentially the mirror image of the meniscus M' illustrated in FIG. 5B. Accordingly, when pressure is applied to the fluid in the nozzle 150, the ejected droplet D" exits the nozzle 150 with the opposite deflection, e.g., deflected to the left.

As described above, when a voltage is selectively applied to one or the other of the electrode segments 120*a*, 120*b*, the direction of ejected fluid droplets may be changed, e.g., to deflect the fluid to the right or left. In operation, the printhead may eject fluid to the left and the right alternately by alternately applying voltage to the first and second electrode segments 120*a*, 120*b*, i.e., by applying voltage only to the fluid and the electrode segment 120*a*, then applying voltage only to the fluid and the electrode segment 120*b*, in alternating cycles. Of course, simpler or more complex arrangements may also be provided. For example, a single electrode segment may be provided along one side of the nozzle, without a complementary electrode segment on the opposing side of the nozzle 150. That is, e.g., the electrode segment 120*a* may be provided while the electrode segment 120*b* is omitted. In that case, a fluid droplet D may be ejected straight from the nozzle 150 when no voltage is applied to the electrode segment 120*a*, and a fluid droplet D' may be ejected at an angle, without provisions for ejecting droplets with an opposite deflection. Thus, the DPI of a printed image may be twice the CPI of the printhead nozzles.

Figure 5D:
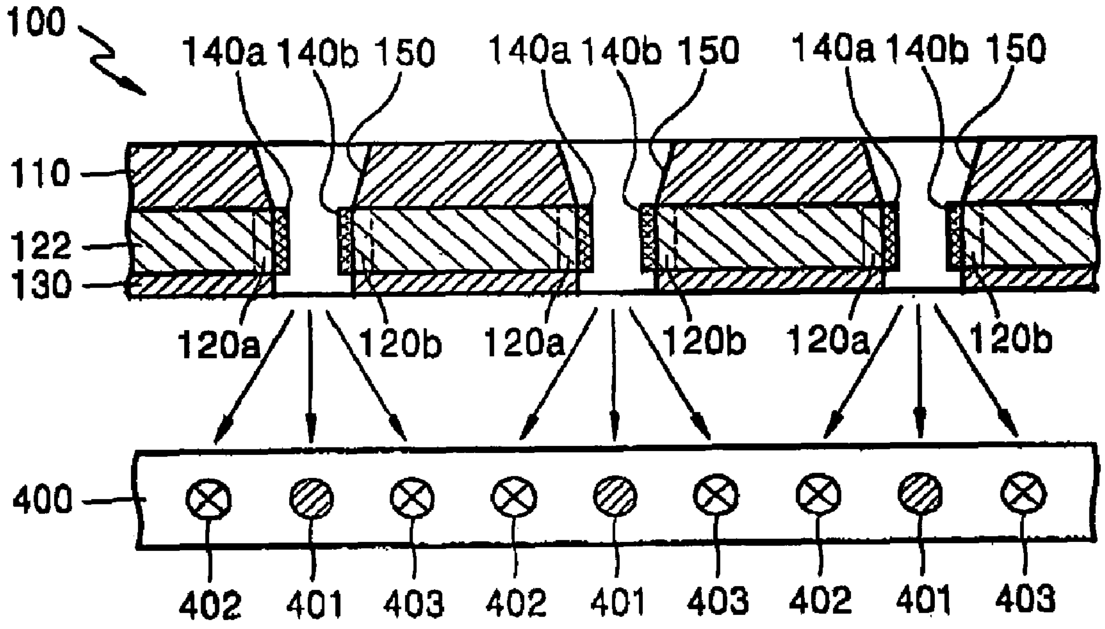

Referring to FIG. 5D, a plurality of nozzles 150 may be arranged on the printhead 100. Thus, the printhead has a predetermined CPI. When voltage is selectively applied to the electrode segments 120*a* and 120*b* of the electrode 120 formed on the nozzle 150, the contact angles of the ink with the hydrophobic insulating segments 140*a* and 140*b* of the insulating layer 140 vary due to electro-wetting, thereby varying the direction of ejected fluid droplets. Thus, dots 401, formed by droplets that are ejected straight from the nozzle 150, and deflected dots 402 and 403, formed by deflected droplets, are formed in a single line on the print medium 400, e.g., a sheet of paper, and spaced apart by a predetermined interval. As a result, the DPI of an image formed on the print medium, e.g., the paper 400, may be three times the CPI of the printhead 100.

Figure 6:
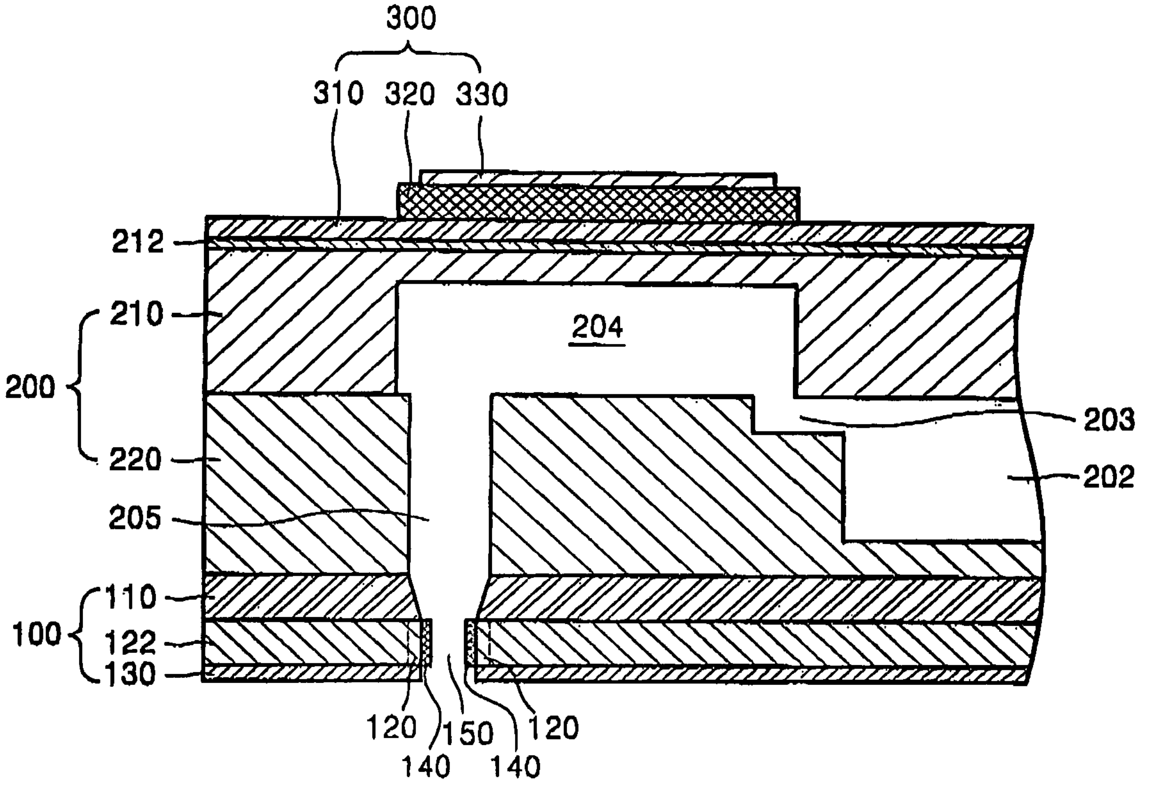
FIG. 6 illustrates a schematic sectional view of a printhead according to an embodiment of the present invention.
Figure 7:
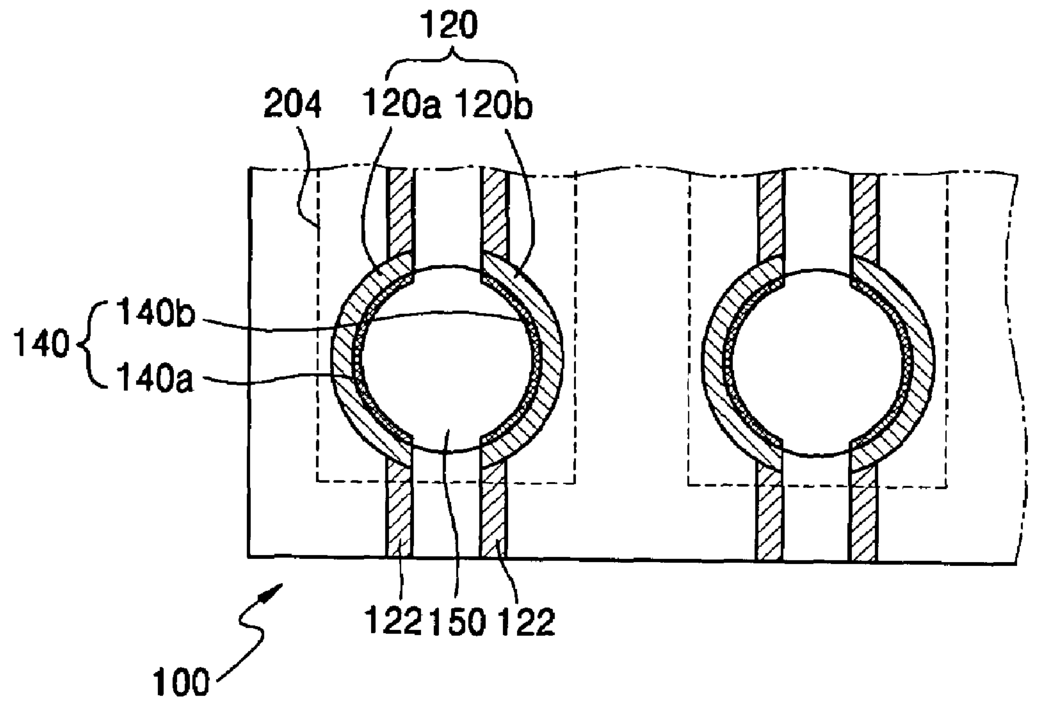
FIG. 7 illustrates a partial plan view of a printhead according to an embodiment of the present invention.
Figure 8:
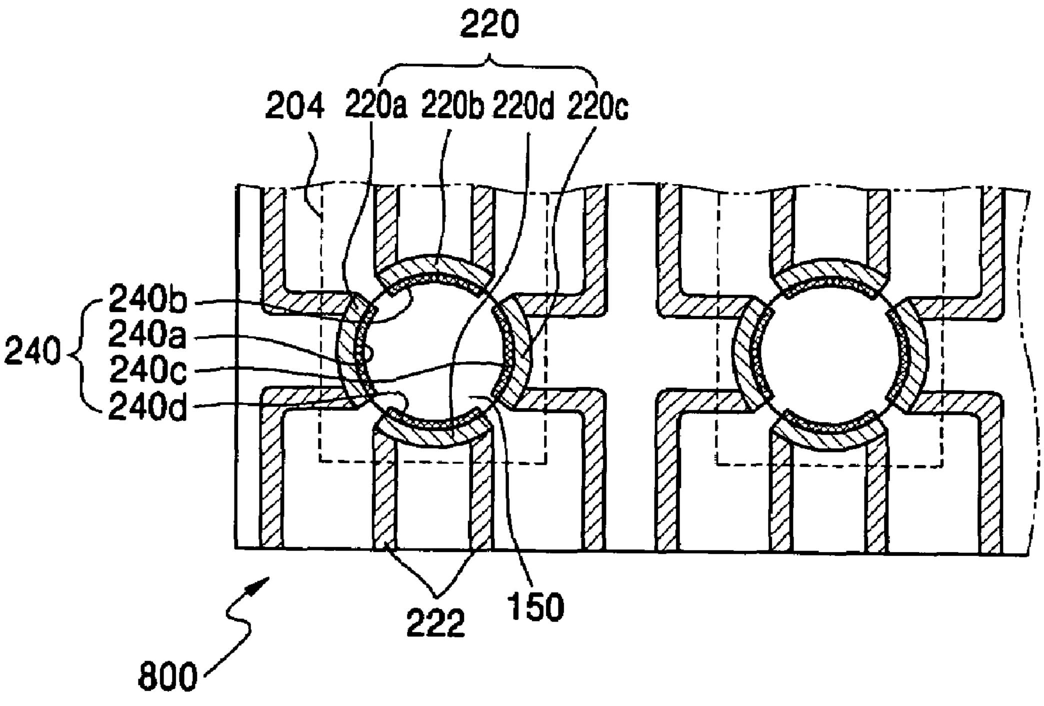
FIG. 8 illustrates a partial plan view of a printhead according to another embodiment of the present invention.

FIG. 6 illustrates a schematic sectional view of a printhead according to an embodiment of the present invention, FIG. 7 illustrates a partial plan view of a printhead according to an embodiment of the present invention and FIG. 8 illustrates a partial plan view of a printhead according to another embodiment of the present invention. In particular, FIG. 6 illustrates a piezoelectric inkjet printhead, the printhead illustrated in FIG. 7 includes a pair of independently operable electrodes and the printhead illustrated in FIG. 8 includes four independently operable electrodes.

Referring to FIG. 6, the exemplary inkjet printhead may include a channel plate 200 having an ink channel including an ink chamber 204, and a piezoelectric actuator 300 disposed on a top surface of the channel plate 200 to generate a driving force for ejecting ink from the ink chambers 204. A nozzle plate 100 may be attached to a bottom surface of the channel plate unit 200 and may be provided with a plurality of nozzles 150 penetrating therethrough to eject ink out of the ink chambers 204.

The ink channel may include, in addition to the ink chamber 204, a manifold 202, functioning as a common channel supplying ink introduced from an ink inlet (not shown) to multiple ink chambers 204, and a restrictor 203 corresponding to the ink chamber 204, functioning as an individual channel supplying ink from the manifold 202 to the ink chamber 204. A damper 205 may be disposed between the ink chamber 204 and the nozzle 150 to concentrate energy, which is generated in the ink chamber by the piezoelectric actuator 300, on the nozzle 150 and to buffer or dampen sudden pressure variations.

A portion of the channel plate 200 may define a top wall, i.e., ceiling, of the pressure chamber 204 and function as a vibration plate upon which the piezoelectric actuator 300 operates. The channel plate 200 may be a unit assembled from first and second channel plates 210 and 220. In this case, the ink chambers 204 may be formed on a bottom surface of the first channel plate 210 to a predetermined depth. The ink chamber 204 may be formed in a rectangular shape having a longitudinal direction corresponding to a direction of ink flow from the manifold 202 to the nozzle 150.

The manifold 202 may be formed on the second channel plate 220 and may be formed on a top surface of the second channel plate 220 to a predetermined depth. Alternatively, the manifold 202 may be formed completely penetrating the second channel plate 220 in a vertical direction. The restrictor 203 may be formed in the top surface of the second channel plate 220 to a predetermined depth and connect the manifold 202 to a first end of the ink chamber 204. The restrictor 203 may be also formed penetrating the second channel plate 220 in a vertical direction. The damper 205 may be formed penetrating a portion of the second channel plate 220 in a vertical direction and corresponding to a second end of the ink chamber 204. The damper 205 may connect the ink chamber 204 to the nozzle 150.

Although the elements constituting the ink channel are separately arranged on the two channel plates 210 and 220 in the above description, this is only an exemplary embodiment. That is, a variety of ink channels may be provided on the inkjet printhead. In addition, the channel plate 200 may be formed of a single plate, two or more plates, etc.

The piezoelectric actuator 300 is provided on a top surface of the first channel plate 210 to provide the driving force for ejecting ink out of the ink chambers 204. The piezoelectric actuator 300 may include a lower electrode 310 disposed on the top surface of the first channel plate 210, to function as a common electrode, a piezoelectric layer 320 disposed on the lower electrode 310, to be transformed by a voltage applied thereto, and an upper electrode 330 disposed on the piezoelectric layer 320, to function as a driving electrode. In detail, an insulating layer 212 may be formed between the lower electrode 310 and the first channel plate 210. The lower electrode 310 may be formed of a single conductive material layer applied on an overall top surface of the insulating layer 212, or may be formed of stacked Ti and Pt layers. The lower electrode 310 may function as a diffusion barrier layer, which prevents inter-diffusion between the first channel plate 210 and the piezoelectric layer 320 formed thereon, as well as functioning as a common electrode. The piezoelectric layer 320 corresponds to the ink chamber 204 and is transformed by a voltage applied thereto, such that a vibration plate defined by the top of the ink chamber 204 is reversibly deformed. The piezoelectric layer 320 may be formed of a piezoelectric material, e.g., a lead zirconate titanate (PZT) ceramic material. The upper electrode 330 functions to apply a driving voltage to the piezoelectric layer 320 and is disposed on the piezoelectric layer 320.

The printhead may also include a nozzle plate 100. As illustrated, the nozzle plate may be attached or formed on the bottom of the second channel plate 220 and have a nozzle 150 defined therein so as to communicate with the damper 205. The nozzle plate 100 may include an electrode 120 disposed around an inner circumference of the nozzle 150, a hydrophobic insulating layer 140 formed on a surface of the electrode 120 so as to contact the ink, and a wire pattern 122 connected to the electrode 120. The nozzle plate 100 may include a substrate 110 in which part of the nozzle 150 is defined. The part of the nozzle 150 defined in the substrate 110 may have a tapered cylindrical shape, i.e., a conical shape. The electrode 120 and the wire pattern 122 may be formed on the substrate 110 and be covered with a protective layer 130. The substrate 110 may be formed of a silicon wafer or an inexpensive base substrate for a printed circuit board (PCB).

Where multiple nozzles 150 are included on the printhead, a corresponding electrode 120 may be formed along the inner circumference of each nozzle 150. The electrode 120 may be formed of highly conductive material, e.g., a metal such as copper (Cu), and may be formed of a material, e.g., Cu again, that is commonly used in manufacturing PCBs.

Referring to FIG. 7, the electrode 120 may include one or more electrode segments. As illustrated, electrode 120 includes two arc-shaped electrode segments 120*a* and 120*b* arranged along the inner circumference of the nozzle 150. Of course, the present invention is not limited to one or two electrode segments, and 3, 4, etc. electrode segments may be provided as necessary. The insulating layer 140 may be formed of a hydrophobic material as two arc-shaped insulating segments 140*a* and 140*b* formed on the electrode segments 120*a* and 120*b*, respectively. The two arc-shaped segments 140*a* and 140*b* are disposed so as to contact the fluid, e.g., ink in the nozzle 150. As described above, when a voltage is applied between the ink in the nozzle 150 and the respective electrode segments 120*a* and 120*b*, the contact angle of the ink with the respective insulating segments 140*a* and 140*b* varies due to electro-wetting, thereby enabling deflection of the ink droplets ejected through the nozzle 150.

A variety of wire patterns 122 may be formed. The wire pattern 122 may be formed such that it can be connected to the respective electrode segments 120*a* and 120*b* to independently apply a voltage to the respective electrode segments 120*a* and 120*b*, i.e., configured to apply the voltage between ink in the nozzle 150 and the respective segments 120*a* and 120*b*, such that the electrode segments 120*a* and 120*b* may be independently and alternately energized. That is, the wire pattern 122 is patterned so as to enable individual control of the electrode segments 120*a* and 120*b*, wherein the contact angle can be varied in two directions. The wire pattern 122 may be formed of, e.g., Cu, and may be formed of the same material used for the electrode 120. That is, both may be formed of, e.g., Cu.

The protective layer 130 may be disposed to cover the electrode 120 and the wire pattern 122 that are formed on the substrate 110, thereby protecting and insulating them. Since the protective layer 130 may define an outer surface of the nozzle plate 100, it may be formed of a hydrophobic material, e.g., a photo solder resist (PSR) material.

In another embodiment, illustrated in FIG. 8, a nozzle plate 800 may include an insulating layer 240 having four insulating segments 240*a*, 240*b*, 240*c* and 240*d*, which are evenly arranged along the inner circumference of the nozzle 150, e.g., at 90° intervals, i.e., 90° on center. An electrode 220 may include four electrode segments 220*a*, 220*b*, 220*c* and 220*d*, which may be formed along the inner circumference of the nozzle 150 at, e.g., 90° intervals, and correspond to the insulating segments 240*a*, 240*b*, 240*c* and 240*d*. It will be appreciated that, when each of the electrode 220 and the hydrophobic insulating layer 240 is divided into four segments, the deflection of ejected ink droplets may be varied in greater variety of directions than when they are divided into a lesser number of segments.

The insulating and electrode segments may all be formed in an arc shape. The wire pattern 222 may be formed such that it can be connected to the respective electrode segments 220*a*, 220*b*, 220*c* and 220*d* to independently apply a voltage to the respective electrode segments 220*a*, 220*b*, 220*c* and 220*d*, although the wire pattern 222 is not limited to this configuration and a variety of wire patterns may be formed.

In the examples described in detail above, the insulating layers and the electrodes are divided into two or four segments. However, the present invention is not limited to the illustrated examples, and printheads according to the present invention may include one, three, five, six, etc. segments, as required by the particular application.

Further, although described above in the context of a piezoelectric inkjet printhead, the present invention is not limited to such printheads and may be applied to a thermal inkjet printhead and a variety of other fluid ejecting systems besides inkjet printheads.

Figure 9A:
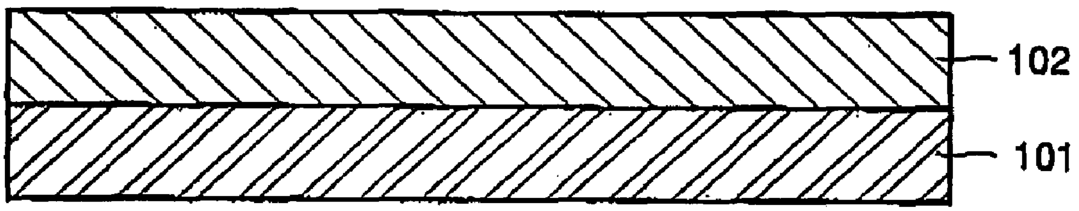
FIGS. 9A-9E illustrate sectional views of stages in a method of manufacturing a nozzle plate according to the present invention.

A method of manufacturing the nozzle plate will be described with reference to FIGS. 9A-9E, which illustrate sectional views of stages in a method of manufacturing a nozzle plate according to the present invention. Referring to FIG. 9A, a starting substrate 101 may be provided and a conductive layer 102 may be formed thereon, to be patterned to form the electrode 120 and the wire pattern 122. In detail, the starting substrate 101 may be formed of a base substrate for a PCB, e.g., a polyamide base substrate. In order to form the electrode 120 and the wire pattern 122, a conductive material, e.g., a metal such as Cu, is deposited to form conductive layer 102 and patterned to form an electrode 120 having a shape such as that shown in FIGS. 7 and 8. The electrode 120 may be divided into two, four, etc., segments and the wire pattern 122 may be connected thereto and configured so as to allow independent control of each electrode segment.

Figure 9B:
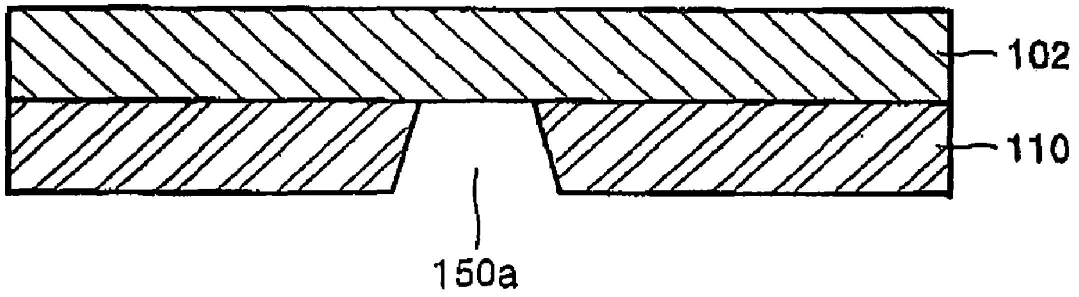

Referring to FIG. 9B, the starting substrate 101 may be processed to yield the substrate 110 including a partially formed nozzle 150*a*. Partially forming the nozzle 150*a* may include processing the starting substrate 101 to form a void therein using, e.g., a laser. The void may have a tapered cylindrical shape, i.e., a conical or truncated conical shape.

Figure 9C:
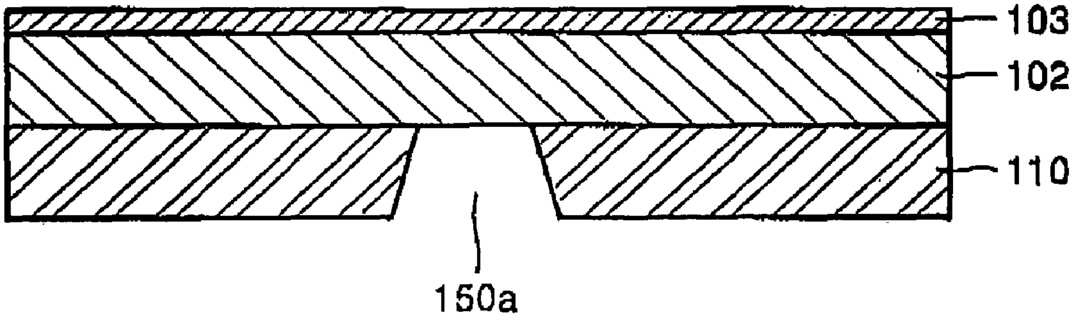

Referring to FIG. 9C, a layer 103 may be formed on the substrate 110, the electrode 120 and the wire pattern 122 (layer 103 will be referred to as protective layer 130 after it is patterned). The layer 103 may be formed of, e.g., a hydrophobic insulating material such as PSR, which is widely used in PCB manufacturing. The layer 103 may be formed before or after formation of the nozzle 150, including prior to the partial formation of the nozzle 150*a* described above.

Figure 9D:
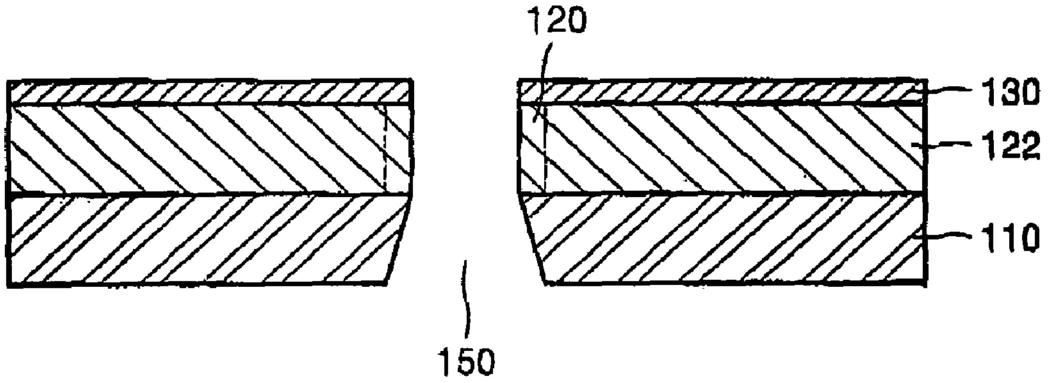

Referring to FIG. 9D, a second portion of the nozzle 150, e.g., the remaining portion, may be formed by processing the electrode 120 and the layer 103. The perforation of the nozzle 150 through the layer 103 yields the protective layer 130. The formation of this second portion of the nozzle 150 may be performed by, e.g., drilling or etching the electrode 120 and the layer 103. Note that initial patterning of the electrode 120 may leave the electrode segments conjoined by a central region (not shown), in which case the formation of the second portion of the nozzle may include removing the central region of the electrode, so as to completely separate the electrode segments from each other. Thus, the electrode segments may be self-aligned, i.e., precisely formed on the inner circumference of the nozzle 150, and exposed only at the inner circumference of the nozzle 150.

Figure 9E:
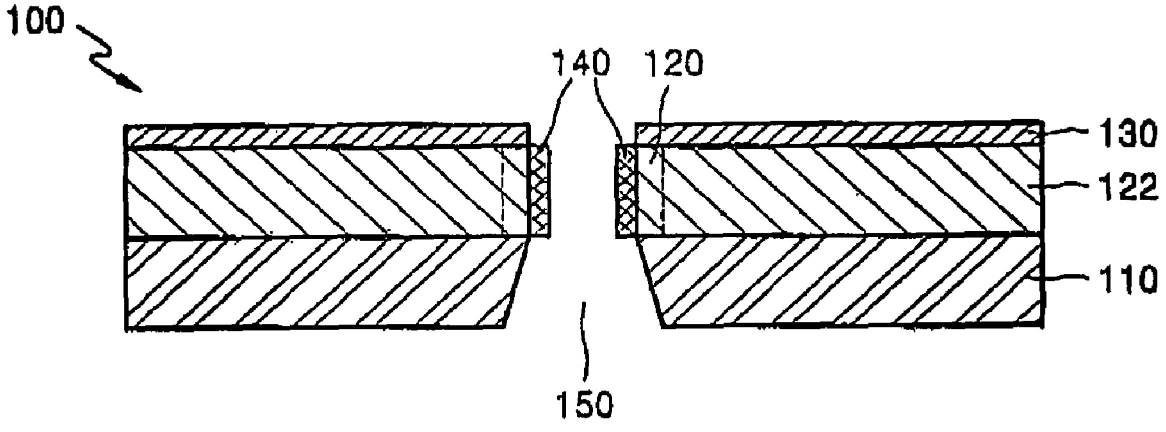

Referring to FIG. 9E, a hydrophobic insulating layer 140 may be formed on the exposed surfaces of the electrode 120, i.e., on the individual electrode segments. In detail, the insulating layer 140, e.g., a hydrophobic layer, may be formed by depositing, e.g., $SiO_2$ or SiN through a plasma enhanced chemical vapor deposition (PECVD) method, or by depositing, e.g., $Ta_2O_5$through an atomic layer deposition (ALD) method. The insulating layer 140 is deposited only on the exposed surfaces of the segments of the electrode 120 using the described deposition methods. As a result, the insulating layer 140 formed thereby is also divided into segments, the number of which corresponds to the number of electrode segments. That is, the deposition of the insulating layer 140 may directly form the insulating layer segments, with no need for a separate patterning step.

As described above, since the nozzle plate 100 may use a base substrate 110 for the PCB, it may be manufactured using PCB manufacturing processes that are simple and well developed, thereby reducing manufacturing costs.

Exemplary embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims. For example, the nozzle plate according to the present invention may be applied to a thermal inkjet printhead as well as the illustrated piezoelectric inkjet printhead, or to a variety of other fluid ejecting systems.

What is claimed is:

1. A nozzle plate having at least one nozzle, the nozzle plate comprising:

a substrate;

at least one electrode segment disposed around a circumference of the nozzle and disposed on the substrate;

an insulating layer disposed on the electrode segment, the insulating layer contacting fluid inside the nozzle; and a wire pattern electrically coupled to the electrode segment, wherein the insulating layer and the at least one electrode segment are configured such that a surface tension of the fluid in contact with the insulating layer changes according to an electric field across the insulating layer in response to voltage applied to the at least one electrode and the fluid contacting the insulating layer.

2. The nozzle plate as claimed in claim 1, wherein the electrode segment extends along less than about half of the circumference of the nozzle, and an interface plane between the electrode segment and the insulating layer is substantially perpendicular to a plane supporting the nozzle plate.

3. The nozzle plate as claimed in claim 1, wherein there are at least two electrode segments disposed along the circumference of the nozzle, the insulating layer is divided into at least two insulating layer segments corresponding to the electrode segments, and the wire pattern is electrically coupled to the electrode segments.

4. The nozzle plate as claimed in claim 3, wherein the wire pattern is individually coupled to each electrode segment, such that each electrode segment can be alternately energized.

5. The nozzle plate as claimed in claim 3, wherein the insulating layer segments form a portion of an inner surface of the nozzle, such that the inner surface of the nozzle includes at least two separate sections defined by the insulating layer segments.

6. The nozzle plate as claimed in claim 3, wherein the nozzle has four insulating layer segments and four corresponding electrode segments arranged at equal intervals along the circumference of the nozzle.

7. The nozzle plate as claimed in claim 1, wherein the wire pattern and the electrode segments are substantially coplanar and are positioned on a substrate, the nozzle penetrating through the substrate and the wire pattern.

8. The nozzle plate as claimed in claim 7, wherein the substrate is a base substrate for a printed circuit board.

9. The nozzle plate as claimed in claim 7, further comprising a protective layer on the electrode segments and on the wire pattern, the wire pattern being between the protective layer and the substrate.

10. The nozzle plate as claimed in claim 9, wherein the protective layer is a hydrophobic insulating material.

11. The nozzle plate as claimed in claim 10, wherein the protective layer is a photo solder resist.

12. The nozzle plate as claimed in claim 1, wherein the electrode segment is a low resistance material.

13. The nozzle plate as claimed in claim 12, wherein the electrode segment and the wire pattern are copper.

14. The nozzle plate as claimed in claim 1, wherein the insulating layer is a hydrophobic layer.

15. The nozzle plate of claim 14, wherein the insulating layer includes at least one of $SiO_2$, SiN, and $Ta_2O_5$.

16. The nozzle plate as claimed in claim 1, wherein the insulating layer is a hydrophilic layer.

17. A printhead, comprising:

a channel region including a plurality of fluid chambers;

an actuator; and a nozzle region including a plurality of nozzles, each nozzle coupled to a corresponding fluid chamber, wherein each nozzle includes:

at least one electrode segment disposed around a circumference of the nozzle;

an insulating layer disposed on the electrode segment, the insulating layer contacting the fluid inside the nozzle; and a wire pattern electrically coupled to the electrode segment, wherein the insulating layer and the at least one electrode segment are configured such that a surface tension of the fluid in contact with the insulating layer changes according to an electric field across the insulating layer in response to voltage applied to the at least one electrode and the fluid contacting the insulating layer.

18. The printhead as claimed in claim 17, further comprising an electric circuit, the electric circuit coupled to the wire pattern and configured to supply a voltage having a first polarity to the fluid and to supply a voltage having a second polarity opposite the first polarity to the wire pattern.

19. The printhead as claimed in claim 17, wherein there are at least two electrode segments disposed along the circumference of the nozzle, the insulating layer is divided into at least two segments corresponding to the electrode segments, and the wire pattern is electrically coupled to the electrode segments.

20. The printhead as claimed in claim 19, wherein the at least two electrode segments includes a first electrode segment and a second electrode segment, such that the nozzle plate includes a plurality of first electrode segments and a plurality of second electrode segments, the printhead further comprising an electric circuit coupled to the wire pattern and configured to supply a voltage having a first polarity to the fluid and to alternately supply a voltage having a second polarity to the first and second electrode segments.

21. The printhead as claimed in claim 20, wherein the electric circuit is configured to supply the voltage having the second polarity to the plurality of first electrode segments simultaneously.

22. The printhead as claimed in claim 19, wherein the nozzle includes four insulating layer segments and four corresponding electrode segments arranged at equal intervals along the circumference of the nozzle.

23. The printhead as claimed in claim 17, further comprising:

a substrate on which the electrode segment and the wire pattern are disposed; and a protective layer disposed on the substrate so as to cover the electrode segment and the wire pattern.

24. A method of manufacturing a nozzle plate having at least one nozzle for ejecting fluid, comprising:

forming an electrode having at least one segment and a wire pattern connected to the segment of the electrode on a substrate;

forming a protective layer on the substrate;

forming the nozzle, such that the at least one electrode segment is circumferentially inside the nozzle to extend along an inner surface of the nozzle, the inner surface of the nozzle facing fluid inside the nozzle; and forming an insulating layer only on a surface of the segment of the electrode, the insulating layer contacting the fluid inside the nozzle.

25. The method as claimed in claim 24, wherein forming the electrode and the wire pattern includes depositing a metal layer on the substrate and patterning the metal layer to form both the electrode and the wire pattern.

26. The method as claimed in claim 24, wherein forming the protective layer includes depositing a hydrophobic insulating material.

27. The method as claimed in claim 24, wherein forming the nozzle includes:

forming a first portion of the nozzle by forming a tapered void in the substrate using a laser; and forming a second portion of the nozzle by forming a cylindrical void in the electrode and the protective layer using drilling or etching.

28. The method as claimed in claim 27, wherein forming the second portion of the nozzle exposes the segment of electrode along a circumference of the cylindrical void.

29. The method as claimed in claim 24, wherein the electrode has at least two segments, the insulating layer is formed only on each of the segments of the electrode, and forming the insulating layer only on each of the segments of the electrode includes forming a number of hydrophobic insulating layer segments on the segments of the electrode, the number of hydrophobic insulating layer segments equal to the number of segments of the electrode.

30. The method as claimed in claim 29, wherein forming the insulating layer only on each of the segments of the electrode includes using plasma enhanced chemical vapor deposition to selectively deposit $SiO_2$ or SiN directly on an exposed surface of each segment of the electrode and not on any adjacent regions of the nozzle plate.

31. The method as claimed in claim 29, wherein forming the insulating layer only on each of the segments of the electrode includes using atomic layer deposition to selectively deposit $Ta_2O_5$ directly on an exposed surface of each segment of the electrode and not on any adjacent regions of the nozzle plate.

32. A method of operating a printhead including a nozzle plate having at least one nozzle for ejecting fluid, at least one electrode segment along a circumference of the nozzle an inner surface of the nozzle facing fluid inside the nozzle, an insulating layer on a surface of the electrode segment to contact fluid inside the nozzle, and a wire pattern electrically coupled to the electrode segment, the method comprising:

applying pressure to a fluid contained in the printhead in order to eject a first droplet of the fluid from the nozzle;

applying a voltage having a first polarity to the fluid contained in the printhead; and applying a voltage having a second polarity opposite the first polarity to the electrode segment in order to eject the first droplet in a first direction, the voltages having the first and second polarities generating an electric field across the insulating layer, such that a surface tension of the fluid in contact with the insulating layer changes.

33. The method as claimed in claim 32, wherein the electrode segment is electrically insulated from the fluid by an insulating layer and applying the voltages having the first and second polarities creates an electric potential across the insulating layer to change a contact angle of the fluid with respect to the nozzle.

34. The method as claimed in claim 32, further comprising:

applying pressure to the fluid contained in the printhead in order to eject a second droplet of the fluid from the nozzle; and removing the voltage having the second polarity in order to eject the second droplet in a second direction, wherein the first direction is not coaxial with the nozzle and the second direction is coaxial with the nozzle.

35. The method as claimed in claim 34, wherein the nozzle has two electrode segments disposed adjacent thereto, the electrode segments formed on opposite sides of the nozzle, the method further comprising alternately applying the voltage having the second polarity to each of the two electrode segments.

* * * * *